(12) United States Patent
Yan et al.

(10) Patent No.: US 11,164,949 B2
(45) Date of Patent: Nov. 2, 2021

(54) SEMICONDUCTOR STRUCTURE AND METHOD FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Wang Yan, Shanghai (CN); Fu Xiao, Shanghai (CN); Hong Zhongshan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/818,321

(22) Filed: Mar. 13, 2020

(65) Prior Publication Data

US 2020/0411652 A1    Dec. 31, 2020

(30) Foreign Application Priority Data

Jun. 28, 2019    (CN) .......................... 201910577056.6

(51) Int. Cl.
| | |
|---|---|
| *H01L 29/417* | (2006.01) |
| *H01L 21/768* | (2006.01) |
| *H01L 29/66* | (2006.01) |
| *H01L 29/78* | (2006.01) |
| *H01L 21/8234* | (2006.01) |

(52) U.S. Cl.
CPC .. *H01L 29/41791* (2013.01); *H01L 21/76895* (2013.01); *H01L 21/823431* (2013.01); *H01L 29/66795* (2013.01); *H01L 29/7851* (2013.01)

(58) Field of Classification Search
CPC .................. H01L 29/41791; H01L 21/823431
See application file for complete search history.

(56) References Cited

U.S. PATENT DOCUMENTS

2020/0006545 A1 *    1/2020    Liu .................. H01L 21/324

* cited by examiner

*Primary Examiner* — Farun Lu

(57) ABSTRACT

A semiconductor structure and a formation method thereof are provided. The formation method includes: providing a substrate and a fin, a gate structure being formed on the substrate, the gate structure spanning the fin and covering a partial sidewall and a partial top of the fin, and a source/drain doping region being formed in the fin on both sides of the gate structure; forming a first dielectric layer on the substrate, the first dielectric layer exposing the top of the fin; forming an etch stop layer to conformally cover the first dielectric layer and the fin and the source/drain doping region exposed by the first dielectric layer; forming a second dielectric layer on the etch stop layer; and forming a conductive plug penetrating through the second dielectric layer and the etch stop layer, the conductive plug spanning the fin, and the conductive plug being connected to the source/drain doping region. Under the action of a first dielectric layer, the effective area between a conductive plug and a gate structure is reduced, and the parasitic capacitance between a conductive plug and a device gate structure is reduced accordingly.

14 Claims, 8 Drawing Sheets

SEMICONDUCTOR STRUCTURE AND METHOD FORMATION METHOD THEREOF

RELATED APPLICATIONS

The present application claims priority to Chinese Patent Appln. No. 201910577056.6, filed Jun. 28, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a formation method thereof.

Related Art

In semiconductor manufacturing, in order to better adapt to reduction of a feature size, semiconductor processes are beginning to transit from a planar MOSFET to a more efficient three-dimensional transistors, such as a fin field effect transistor (FinFET). In the FinFET, a gate structure may control an ultra-thin body (fin) from at least two sides. Compared with the planar MOSFET, the gate structure has stronger control ability on a channel, and can well suppress a short channel effect; and the FinFET has better compatibility with existing integrated circuit manufacturing than other devices.

After forming a semiconductor device, it is necessary to use a plurality of metal layers to connect the semiconductor devices together to form a circuit. The metal layer includes an interconnect line and a conductive plug (CT) formed in a contact hole, where the conductive plug in the contact hole is connected to the semiconductor device, and the interconnect line connects conductive plugs on different semiconductor devices to form a circuit. For example, a conductive plug in a fin field effect transistor includes a conductive plug electrically connected to a gate structure, and a conductive plug electrically connected to a source/drain doping region.

However, as device feature sizes continue to decrease, the size of the source/drain doping region also decreases proportionally. Therefore, in order to reduce the critical dimension (CD) and overlay precision requirements of a lithography process, a trench conductive plug (trench CT) has been introduced. The fin field effect transistor (FinFET) is taken as an example. The trench conductive plug has a strip shape, which extends in the same direction as an extending direction of a gate structure and spans a fin.

SUMMARY

Embodiments and implementations of the present disclosure are directed to a semiconductor structure and a formation method thereof, which improve the performance of a semiconductor structure.

To address the aforementioned problem, embodiments and implementations of the present disclosure provide a formation method of a semiconductor structure. In one form, a formation method includes: providing a substrate and a fin protruding from the substrate, where a gate structure is formed on the substrate, the gate structure spanning the fin and covering a partial sidewall and a partial top of the fin, and a source/drain doping region is formed in the fin on both sides of the gate structure; forming, after forming the source/drain doping region, a first dielectric layer on the substrate exposed by the fin, the first dielectric layer exposing a top of the fin; forming an etch stop layer, the etch stop layer conformally covering the first dielectric layer and the fin and the source/drain doping region exposed by the first dielectric layer; forming a second dielectric layer on the etch stop layer; and forming a conductive plug penetrating through the second dielectric layer and the etch stop layer, the conductive plug spanning the fin, and the conductive plug being connected to the source/drain doping region.

The present disclosure also provides a semiconductor structure. In one form, a semiconductor structure includes: a substrate; a fin, protruding from the substrate; a device gate structure, spanning the fin and covering a partial sidewall and a partial top of the fin; a source/drain doping region, located in the fin on both sides of the device gate structure; a first dielectric layer, located on the substrate exposed by the fin, the first dielectric layer exposing a top of the fin; an etch stop layer, conformally covering the fin and the source/drain doping region exposed by the first dielectric layer, and the first dielectric layer; a second dielectric layer, located on the etch stop layer, the second dielectric layer covering a sidewall of the device gate structure; and a conductive plug, penetrating through the second dielectric layer and the etch stop layer on both sides of the device gate structure, the conductive plug spanning the fin, and the conductive plug being connected to the source/drain doping region.

Compared with the prior art, technical solutions of embodiments and implementations of the present disclosure have the following advantages:

In embodiments and implementations of the present disclosure, after a source/drain doping region is formed, a first dielectric layer is formed on a substrate exposed by a fin, the first dielectric layer exposing the fin; after the first dielectric layer is formed, an etch stop layer is formed, the etch stop layer conformally covering the fin and the source/drain doping region exposed by the first dielectric layer and the first dielectric layer; a second dielectric layer is formed on the etch stop layer, and after a conductive plug penetrating through the second dielectric layer and the etch stop layer is subsequently formed under the action of the first dielectric layer, the height of the conductive plug on both sides of the fin is reduced, thereby reducing the effective area between the conductive plug and a device gate structure, reducing the parasitic capacitance between the conductive plug and the device gate structure accordingly, and further improving the performance (e.g., alternating current performance) of the semiconductor structure.

DETAILED DESCRIPTION

The performance of current semiconductor structures may be further improved. A formation method of a semiconductor structure is now combined to analyze the reasons for the performance to be improved.

FIG. 1-FIG. 8 are schematic diagrams corresponding to various steps of a method for forming a semiconductor structure.

Figure 1:
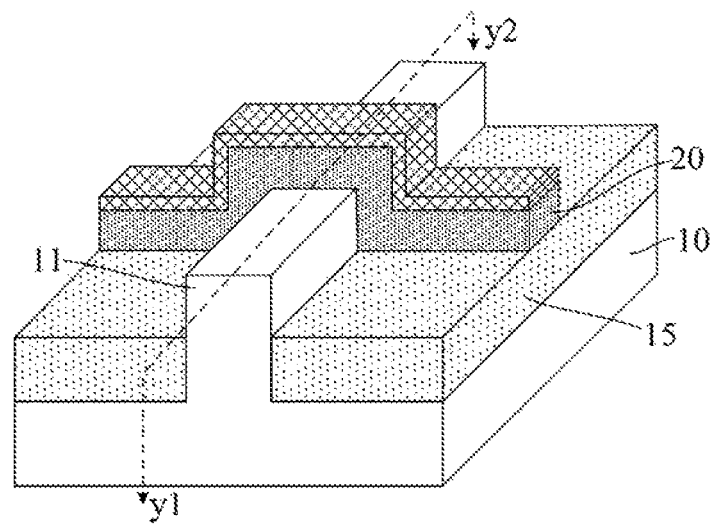
FIG. 1-FIG. 8 are schematic diagrams corresponding to various steps of a method for forming a semiconductor structure.
Figure 2:
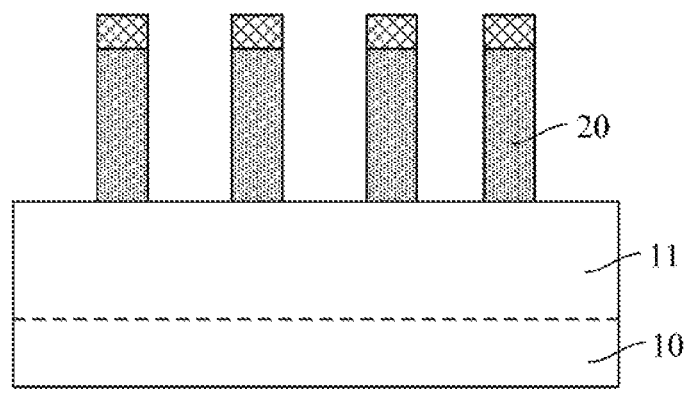

Referring to FIG. 1 and FIG. 2, FIG. 1 is a stereogram, and FIG. 2 is a cross-sectional view of FIG. 1 in a y1y2 direction. A substrate 10 and a fin 11 protruding from the substrate 10 are provided, where an isolating layer 15 is formed on the substrate 10 exposed by the fin 11, the isolating layer 15 covers a partial sidewall of the fin 11, a dummy gate structure 20 is formed on the isolating layer 15, and the dummy gate structure 20 spans the fin 11 and covers a partial sidewall and a partial top of the fin 11.

Figure 3:
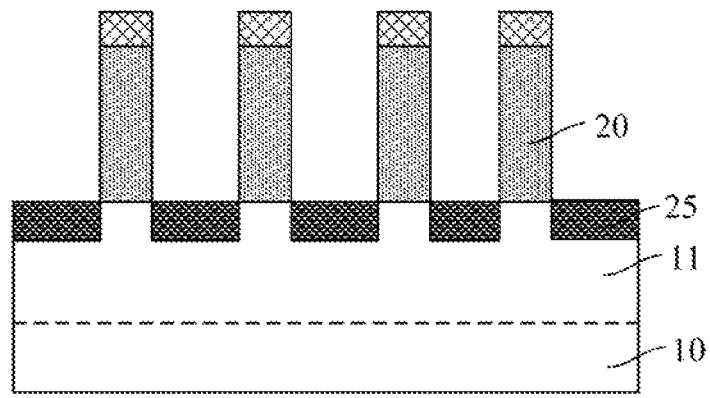

Referring to FIG. 3, FIG. 3 is a cross-sectional view based on FIG. 2, where a source/drain doping region 25 is formed in the fin 11 on both sides of the dummy gate structure 20.

Figure 4:
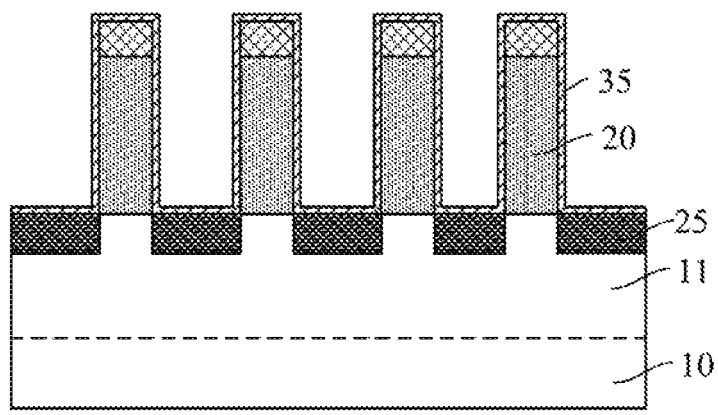

Referring to FIG. 4, an etch stop layer 35 is formed, the etch stop layer 35 conformally covering the substrate 10, the fin 11, the source/drain doping region 25, and the dummy gate structure 20.

Figure 5:
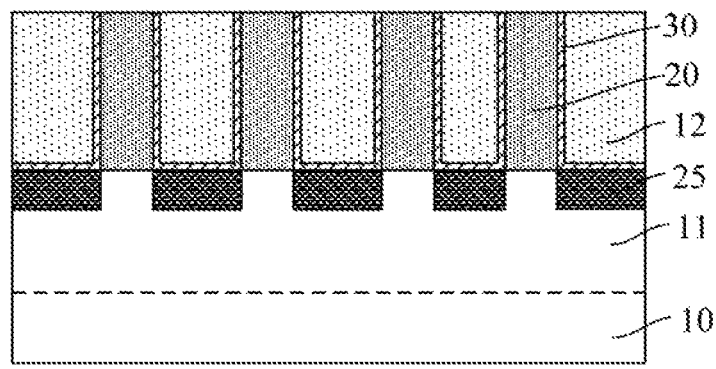

Referring to FIG. 5, an interlayer dielectric layer 12 covering the etch stop layer 35 is formed, the interlayer dielectric layer 12 exposing the top of the dummy gate structure 20.

In the process of forming the interlayer dielectric layer 12, the etch stop layer 35 on the top of the dummy gate structure 20 is removed.

Figure 6:
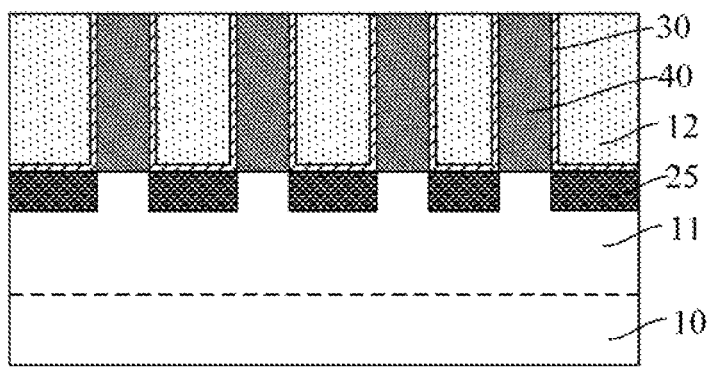

Referring to FIG. 6, the dummy gate structure 20 (as shown in FIG. 5) is removed, and a gate opening (not shown) is formed in the interlayer dielectric layer 12. A device gate structure 40 is formed in the gate opening.

Figure 7:
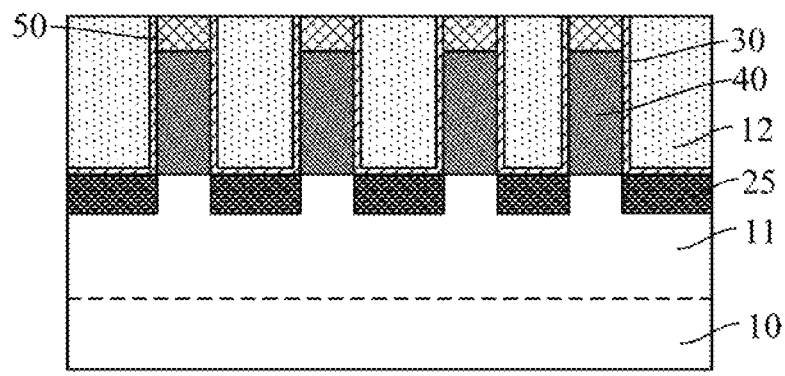

Referring to FIG. 7, the device gate structure 40 of a partial thickness is removed to form a groove (not shown) surrounded by the interlayer dielectric layer 12 and the remaining device gate structure 40. A protective layer 50 is formed in the groove.

Figure 8:
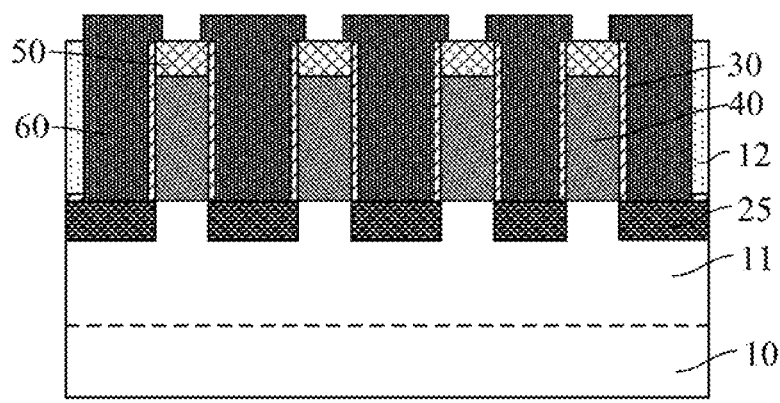

Referring to FIG. 8, a trench is formed in the interlayer dielectric layer 12 and the etch stop layer 35 between adjacent device gate structures 40 by a self-aligned contact (SAC) etching process. The trench spans the fin 11, and the trench exposes the source/drain doping layer 25. A conductive plug 60 is formed in the trench.

The trench spans the fin 11, and thus the conductive plug 60 also spans the fin 11. Correspondingly, the partial conductive plug 60 is located on the source/drain doping layer 25, and the partial conductive plug 60 is located on the isolating layer 15. That is, the height of the conductive plug 60 on the isolating layer 15 is greater than the height of the conductive plug 60 on the source/drain doping layer 25, such that the effective area between the conductive plug 60 and the device gate structure 40 is large, resulting in a large parasitic capacitance between the conductive plug 60 and the device gate structure 40. The performance (e.g., alternating current performance) of the semiconductor structure is further reduced. Moreover, the aforementioned problems occur not only in the self-aligned contact etching process, but also in the non self-aligned contact (non-SAC) etching process.

To address the technical problem, in embodiments and implementations of the present disclosure, after a source/drain doping region is formed, a first dielectric layer is formed on a substrate exposed by a fin, the first dielectric layer exposing the fin; after the first dielectric layer is formed, an etch stop layer is formed, the etch stop layer conformally covers the fin and the source/drain doping region exposed by the first dielectric layer and the first dielectric layer; a second dielectric layer is formed on the etch stop layer, and after a conductive plug penetrating through the second dielectric layer and the etch stop layer is subsequently formed under the action of the first dielectric layer, the height of the conductive plug on both sides of the fin is reduced, thereby reducing the effective area between the conductive plug and a device gate structure, reducing the parasitic capacitance between the conductive plug and the device gate structure accordingly, and further improving the performance (e.g., alternating current performance) of the semiconductor structure.

To make the above objects, features and advantages of the present disclosure more clearly understood, specific embodiments and implementations of the present disclosure will be described in detail below with reference to the accompanying drawings.

FIG. 9-FIG. 24 are schematic diagrams corresponding to various steps in one form of a method for forming a semiconductor structure according to the present disclosure.

Figure 9:
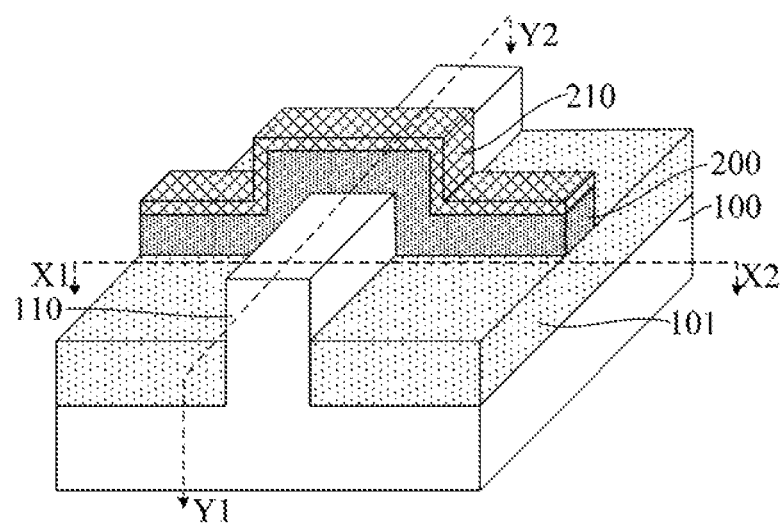
FIG. 9-FIG. 24 are schematic diagrams corresponding to various steps in one form of a method for forming a semiconductor structure according to the present disclosure.
Figure 10:
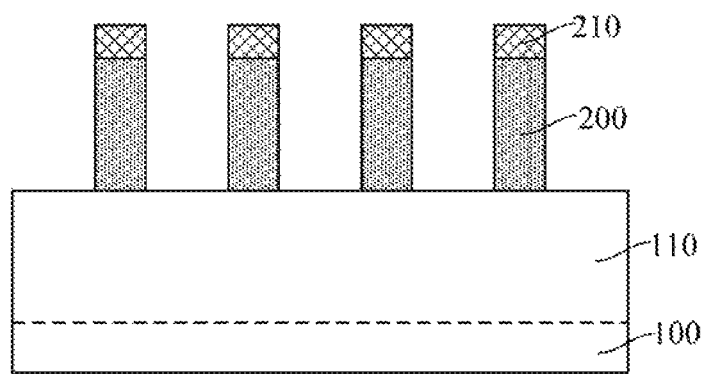
Figure 11:
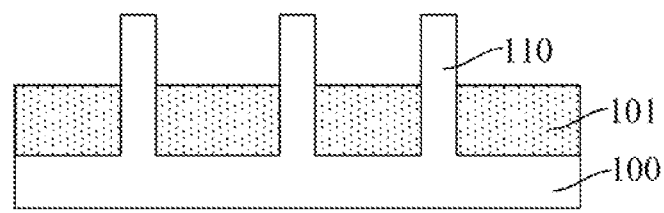

Referring to FIG. 9 to FIG. 11, FIG. 9 is a stereogram, FIG. 10 is a cross-sectional view of FIG. 9 in a Y1Y2 direction, and FIG. 11 is a cross-sectional view of FIG. 9 in an X1X2 direction. A substrate 100 and a fin 110 protruding from the substrate 100 are provided, a gate structure 200 is formed on the substrate 100, and the gate structure 200 spans the fin 110 and covers a partial sidewall and a partial top of the fin 110.

The substrate 100 is used to provide a process platform for subsequent formation of a fin field effect transistor.

In some implementations, the substrate 100 is a silicon substrate. In other implementations, the material of the substrate may also be other materials such as germanium, silicon germanide, silicon carbide, gallium arsenide or indium gallide, and the substrate can also be other types of substrates such as a silicon substrate on an insulator or a germanium substrate on an insulator.

The fin 110 is used to provide a channel for the formed fin field effect transistor.

In some implementations, the fin 110 and the substrate 100 are of an integrated structure. In other implementations, the fin may also be a semiconductor layer epitaxially grown on the substrate for the purpose of accurately controlling the fin height.

To this end, in some implementations, the material of the fin 110 is the same as the material of the substrate 100, and the material of the fin 110 is silicon. In other implementations, the material of the fin may also be a semiconductor material suitable for forming a fin, such as germanium, silicon germanide, silicon carbide, gallium arsenide or indium gallide, and the material of the fin may also be different from the material of the substrate.

As shown in FIG. 11, in some implementations, an isolating layer 101 is formed on the substrate 100 exposed by the fin 110, and the isolating layer 101 covers a partial sidewall of the fin 110.

The isolating layer 101 serves as a shallow trench isolating structure (STI) for isolating adjacent devices. In some implementations, the material of the isolating layer 101 is silicon oxide. In other implementations, the material of the isolating layer may also be other insulating materials such as silicon nitride or silicon oxynitride.

In some implementations, the gate structure 200 is a dummy gate structure. The gate structure 200 is used to occupy a spatial position for subsequent formation of a device gate structure.

In some implementations, for example, the gate structure 200 is a single-layer structure, and the material of the gate structure 200 is polysilicon. In other implementations, the material of the gate structure may also be amorphous carbon. In still other implementations, the gate structure may also be a stacked structure including a dummy gate oxide layer and a dummy gate layer on the dummy gate oxide layer. In other implementations, the gate structure may also be a device gate structure for achieving normal transistor performance.

A gate mask layer 210 is formed on the top of the gate structure 200, the gate mask layer 210 being used as an etch mask for forming the gate structure 200. In some implementations, the material of the gate mask layer 210 is silicon nitride.

In some implementations, after the gate structure 210 is formed, the method further includes: forming a side wall (not shown) on a sidewall of the gate structure 200. The side wall is used to protect the sidewall of the gate structure 200, and is also used to define a formation region of a subsequent source/drain doping region, such that the source and drain doping region has a certain distance from the gate structure 200.

It is to be noted that, for convenience of illustration, the side wall is not shown in some implementations.

Figure 12:
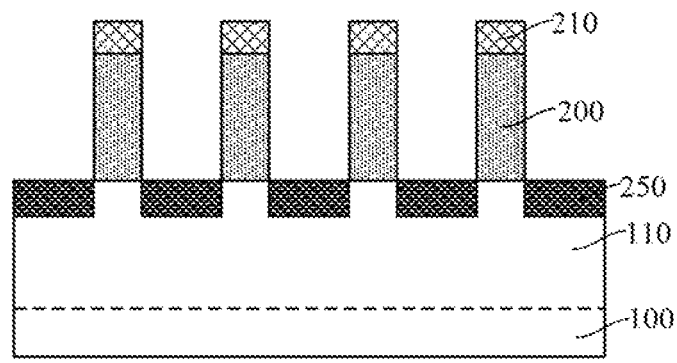

Referring to FIG. 12, after the gate structure 200 is formed, the method further includes: forming a source/drain doping region 250 in the fin 110 on both sides of the gate structure 200.

In some implementations, the step of forming the source/drain doping region 250 includes: forming a groove (not shown) in the fin 110 on both sides of the gate structure 210, forming an epitaxial layer in the groove by using a selective epitaxial growth process, and self-doping ions in situ during the formation of the epitaxial layer to form the source/drain doping region 250.

In some implementations, for example, the formed semiconductor structure is a positive channel metal oxide semiconductor (PMOS) transistor. The material of the source/drain doping region 250 is silicon germanide doped with P-type ions. That is, the material of the epitaxial layer is silicon germanide. The epitaxial layer is used to provide a pressure stress effect on a channel region of the PMOS transistor, thereby increasing the carrier mobility of the PMOS transistor. The P-type ions include B, Ga or In.

In other implementations, the semiconductor structure may also be a negative channel metal oxide semiconductor (NMOS) transistor, and the material of the source/drain doping region is correspondingly silicon carbide or silicon phosphide doped with N-type ions. That is, the material of the epitaxial layer is silicon carbide or silicon phosphide. The epitaxial layer is used to provide a tensile stress effect on a channel region of the NMOS transistor, thereby increasing the carrier mobility of the NMOS transistor. The N-type ions include P, As or Sb.

Figure 13:
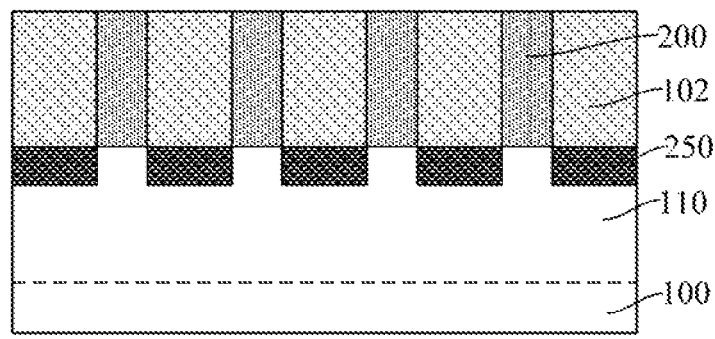
Figure 14:
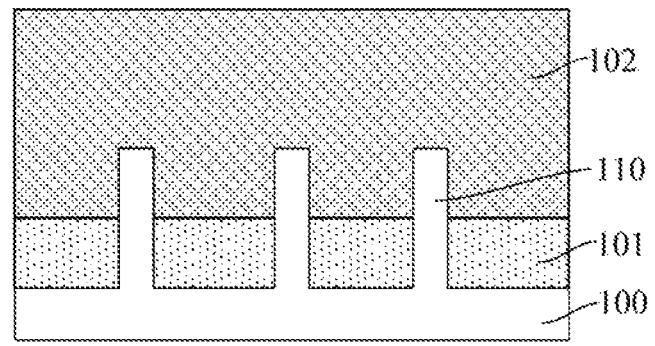
Figure 15:
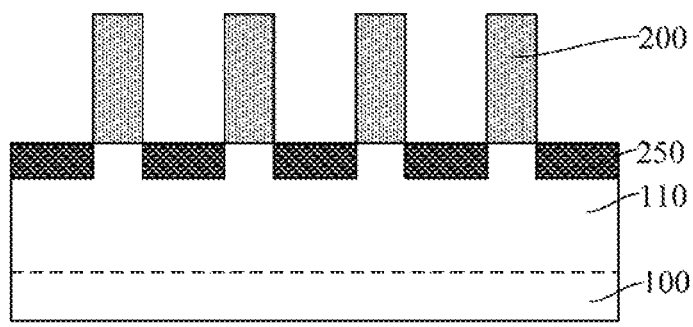
Figure 16:
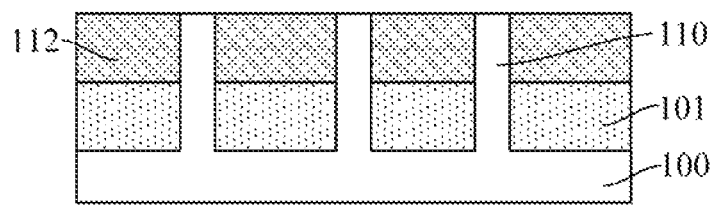

Referring to FIG. 13 to FIG. 16, FIG. 13 is a cross-sectional view in an extending direction of a fin (shown in the Y1Y2 direction in FIG. 9) at a top position of a gate structure, FIG. 14 is a cross-sectional view in an extending direction of a fin (shown in the X1X2 direction in FIG. 9) on one side of a gate structure, FIG. 15 is a cross-sectional view based on FIG. 13, and FIG. 16 is a cross-sectional view based on FIG. 14. After the source/drain doping region 250 is formed, a first dielectric layer 112 (as shown in FIG. 16) is formed on the substrate 100 exposed by the fin 110, the first dielectric layer 112 exposing the top of the fin 110.

The first dielectric layer 112 is used to achieve electrical isolation between adjacent devices, and is also used to provide a process platform for subsequent formation of an etch stop layer.

Therefore, the material of the first dielectric layer 112 is an insulating material. In some implementations, the material of the first dielectric layer 112 is silicon oxide. In other implementations, the material of the first dielectric layer may also be other insulating materials such as silicon oxynitride.

In some implementations, the first dielectric layer 112 exposes the top of the fin 110, so that a subsequently formed etch stop layer can cover the source/drain doping region 250, thereby enabling the etch stop layer to play a corresponding role in the subsequent process of forming a conductive plug. Moreover, the subsequently formed etch stop layer can cover the top of the fin 110 to protect the fin 110.

Specifically, the step of forming the first dielectric layer 112 includes the following steps:

Referring to FIG. 13 and FIG. 14, a first dielectric material layer 102 is formed on the substrate 100 exposed by the fin 110, where a top of the first dielectric material layer 102 is flush with the top of the gate structure 200.

The first dielectric material layer 102 is used to prepare for subsequent formation of a first dielectric layer.

The surface flatness of the first dielectric layer is made higher by first forming the first dielectric material layer 102.

Specifically, the step of forming the first dielectric material layer 102 includes: forming an initial first dielectric material layer (not shown) on the substrate 100 exposed by the fin 110, the initial first dielectric material layer covering the gate mask layer 210 (as shown in FIG. 12); and planarizing the initial first dielectric material layer, and removing the initial first dielectric material layer above the top of the gate structure 200, the remaining initial first dielectric material layer serving as the first dielectric material layer 102. The gate mask layer 210 on the top of the gate structure 200 is also removed during the planarization process.

In some implementations, the initial first dielectric material layer is planarized by a chemical mechanical grinding process. In the step of the chemical mechanical grinding process, an end point detection (EPD) mode may be used, and the top of the gate structure 200 serves as a grinding stop position, so that the surface flatness of the first dielectric material layer 102 is higher.

In other implementations, the initial first dielectric material layer may also be planarized with the top of the gate mask layer as a stop position; and after the planarization process, the remaining initial first dielectric material layer and the gate mask layer are etched back until the top of the gate structure is exposed, and the remaining initial first dielectric material layer after the etching process is used as the first dielectric material layer.

Referring to FIG. 15 and FIG. 16, the first dielectric material layer 102 of a partial thickness is etched back to expose the top of the fin 110, and the remaining first dielectric material layer 102 serves as the first dielectric layer 112.

In some implementations, the first dielectric material layer 102 of a partial thickness is etched back by using a dry etching process. The dry etching process has the characteristics of anisotropic etching, the top surface position of the first dielectric layer 112 is easily controlled by using a dry etching process, and the surface flatness of the first dielectric layer 112 can be improved.

In some implementations, after the first dielectric material layer 102 of a partial thickness is etched back, the top of the first dielectric layer 112 is flush with the top of the fin 110.

After a conductive plug is subsequently formed, the conductive plug spans the fin, and the conductive plug is electrically connected to the source/drain doping region. Therefore, the top position of the first dielectric layer 112 is used to define the bottom position of the conductive plug. The height of the conductive plug on both sides of the fin 110 can be significantly reduced by aligning the top of the first dielectric layer 112 with the top of the fin 110.

In other implementations, the top of the first dielectric layer may also be below the top of the fin according to process requirements.

Figure 17:
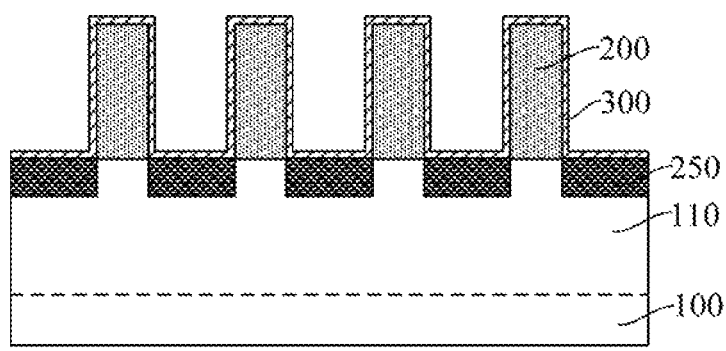
Figure 18:
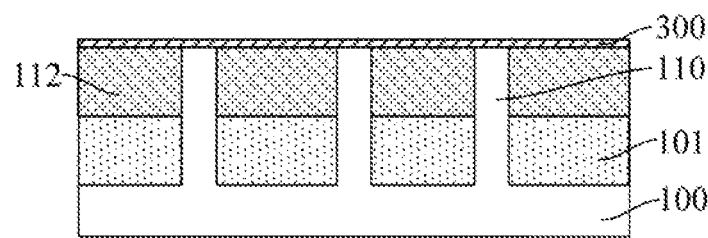

Referring to FIG. 17 and FIG. 18, FIG. 17 is a cross-sectional view based on FIG. 15, and FIG. 18 is a cross-sectional view based on FIG. 16. An etch stop layer 300 is formed, the etch stop layer 300 conformally covering the first dielectric layer 112 and the fin 110 and the source/drain doping region 250 exposed by the first dielectric layer 112.

The subsequent process further includes: forming a second dielectric layer on the etch stop layer 300. The process of forming a conductive plug includes: forming a trench by an etching process. The process of forming the trench includes the step of etching a second dielectric layer, where the top of the etch stop layer 300 is used to define a stop position of the etching process during the process of etching the second dielectric layer.

Therefore, the material of the etch stop layer 300 includes at least one of silicon nitride, silicon carbonitride, silicon carbide or silicon oxynitride. The aforementioned material is a dielectric material, which has high hardness and density, such that the etch stop layer 300 can play a corresponding role.

In some implementations, the material of the etch stop layer 300 is silicon nitride.

Specifically, the etch stop layer 300 is formed by a chemical vapor deposition process.

Correspondingly, the etch stop layer 300 conformally covers the first dielectric layer 112 and a dummy gate structure (i.e., the gate structure 200), the fin 110 and the source/drain doping region 250 exposed by the first dielectric layer 112.

Figure 19:
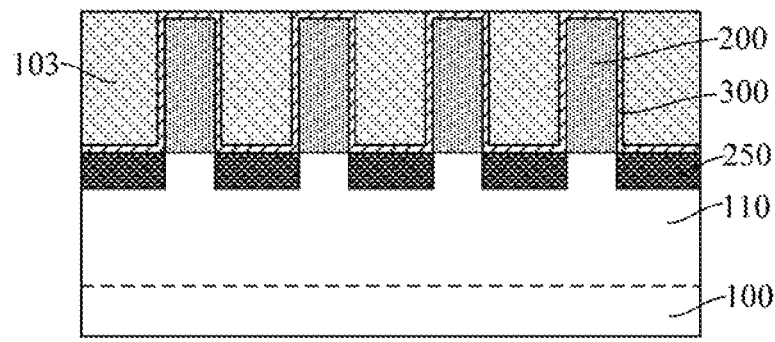
Figure 20:
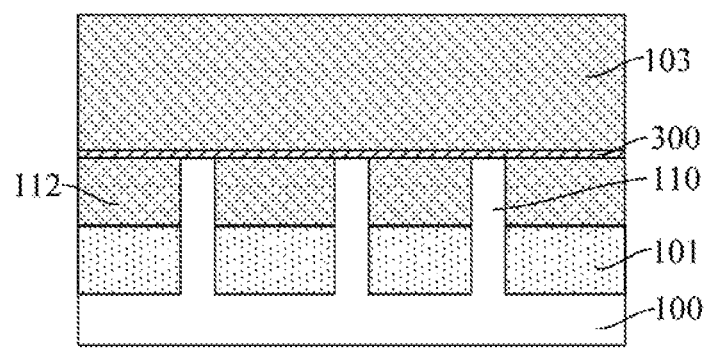

Referring to FIG. 19 and FIG. 20, FIG. 19 is a cross-sectional view based on FIG. 17, and FIG. 20 is a cross-sectional view based on FIG. 18. A second dielectric layer 103 is formed on the etch stop layer 300.

The second dielectric layer 103 is also used to achieve electrical isolation between adjacent devices, and is also used to provide a process basis for subsequent formation of a conductive plug.

Therefore, the material of the second dielectric layer 103 is an insulating material.

In some implementations, the material of the second dielectric layer 103 is silicon oxide. Silicon oxide is a material commonly used as a dielectric layer in the field of semiconductors, which is low in process cost.

Moreover, the materials of the first dielectric layer 112 and the second dielectric layer 103 are both silicon oxide, which significantly alleviates the problem of stress between the first dielectric layer 112 and the etch stop layer 300 and between the second dielectric layer 103 and the etch stop layer 300, such that the adhesion between the first dielectric layer 112 and the etch stop layer 300 and between the second dielectric layer 103 and the etch stop layer 300 is better. A stable oxide-nitride-oxide (ONO) stacked structure is thus obtained.

In other implementations, the material of the second dielectric layer may also be other insulating materials such as silicon oxynitride.

In some implementations, the second dielectric layer 103 covers a sidewall of the gate structure 200.

Specifically, the step of forming the second dielectric layer 103 includes: forming a second dielectric material layer (not shown) covering the etch stop layer 300, planarizing the second dielectric material layer, and removing the second dielectric material layer above the top of the etch stop layer 300, the remaining second dielectric material layer serving as the second dielectric layer 103. The top of the etch stop layer 300 refers to the top of the etch stop layer 300 on the top of the gate structure 200, i.e., the highest position in the top surface of the etch stop layer 300.

The etch stop layer 300 has high hardness and density, and the surface flatness of the second dielectric layer 103 can be improved by using the top of the etch stop layer 300 as a stop position of the planarization process.

In some implementations, the second dielectric material layer is planarized by a chemical mechanical grinding process. In the step of the chemical mechanical grinding process, an end point detection mode may be used, and the top of the etch stop layer 300 serves as a grinding stop position. In other implementations, the planarization process may also include an etchback process and a chemical mechanical grinding process that are performed sequentially.

Figure 21:
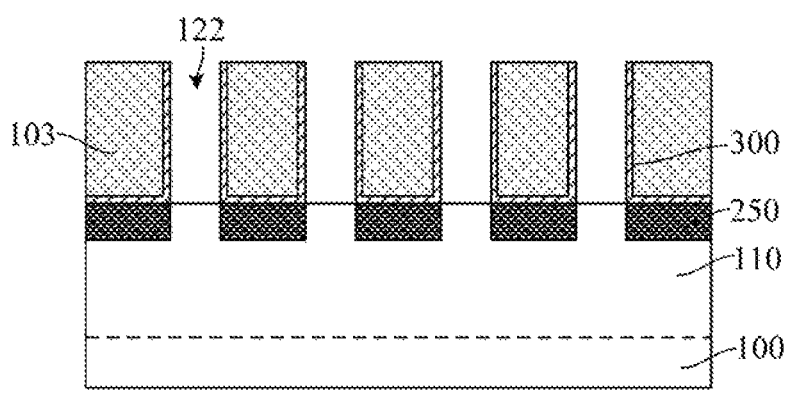

In some implementations, the gate structure 200 is a dummy gate structure. Therefore, referring to FIG. 21, FIG. 21 is a cross-sectional view based on FIG. 19. The formation method further includes: removing the gate structure 200 (as shown in FIG. 19), and forming a gate opening 122 in the first dielectric layer 112 (as shown in FIG. 20) and the second dielectric layer 103.

The gate opening 122 is used to provide a spatial position for subsequent formation of a gate structure. In some implementations, the gate structure 200 spans the fin 110, and therefore the gate opening 122 exposes the partial top and the partial sidewall of the fin 110, and also exposes the partial isolating layer 101.

In some implementations, the step of removing the gate structure 200 includes: removing the gate structure 200 of a partial thickness using a dry etching process; and removing the gate structure 200 of the remaining thickness using a wet etching process.

The dry etching process has the characteristics of anisotropic etching. By selecting the dry etching process, it is advantageous to obtain the gate opening 122 having a relatively vertical sidewall, and the removal efficiency of the gate structure 200 can be improved. The wet etching process has the characteristics of isotropic etching, is easy to realize a higher etching selectivity ratio between different materials, and is advantageous to completely remove the gate structure 200 of the remaining thickness and reduce damage to other film layers. Therefore, by combining the dry etching process and the wet etching process, the process of removing the gate structure 200 is prevented from causing damage to other film layers while improving the removal efficiency of the gate structure 200. For example, the damage to the isolating layer 101, the first dielectric layer 112 and the second dielectric layer 103 can be reduced, and the performance of the device is correspondingly improved.

In other implementations, the gate structure may also be removed by using the dry etching process.

It is to be noted that an etch stop layer 300 is further formed on the top of the gate structure 200. Therefore, before removing the gate structure 200, the method further includes: removing the etch stop layer 300 on the top of the gate structure 200.

Specifically, the etch stop layer 300 on the top of the gate structure 200 is removed by using the dry etching process.

Figure 22:
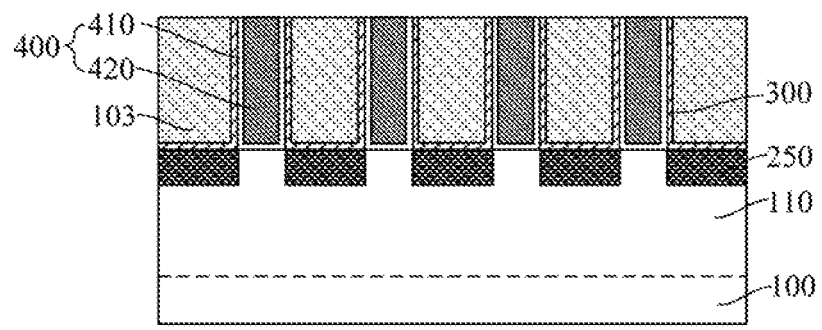

Referring to FIG. 22, a device gate structure 400 is formed in the gate opening 122.

The device gate structure 400 is used to control the turn-on and turn-off of a channel region of a transistor.

In some implementations, the device gate structure 400 is a metal gate structure. Therefore, the step of forming the device gate structure 400 includes: forming a high-k gate dielectric layer 410 conformally covering the bottom and sidewall of the gate opening 122; and after the high-k gate dielectric layer 410 is formed, filling a conductive material in the gate opening 122 to form a gate electrode layer 420.

The high-k gate dielectric layer 410 is used to achieve electrical isolation between the gate electrode layer 420 and a channel.

The material of the high-k gate dielectric layer 410 is a high-k dielectric material. The high-k dielectric material refers to a dielectric material having a relative dielectric constant greater than a relative dielectric constant of silicon oxide. In some implementations, the material of the high-k gate dielectric layer 410 is $HfO_2$. In other implementations, the material of the high-k gate dielectric layer may also be selected from $ZrO_2$, HfSiO, HfS iON, HfTaO, HfTiO, HfZrO or $Al_2O_3$.

In other implementations, when the device gate structure is a polysilicon gate structure, the material of the gate dielectric layer includes at least one of silicon oxide, silicon nitride, silicon oxynitride, silicon carbide, silicon carbonitride, or silicon oxycarbonitride.

The gate electrode layer 420 serves as an electrode for achieving an electrical connection with an external circuit. In some implementations, the material of the gate electrode layer 420 is Al. In other implementations, the material of the gate electrode layer may also be W, Cu, Ag, Au, Pt, Ni or Ti.

It is to be noted that after forming the high-k gate dielectric layer 410 and before forming the gate electrode layer 420, the step of forming the device gate structure 400 further includes the step of forming a functional layer such as a work function layer. For the convenience of illustration, other functional layers are not illustrated in some implementations.

Figure 23:
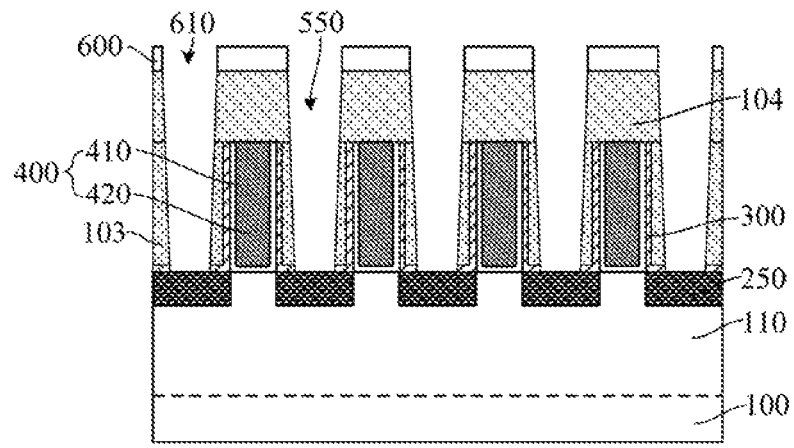
Figure 24:
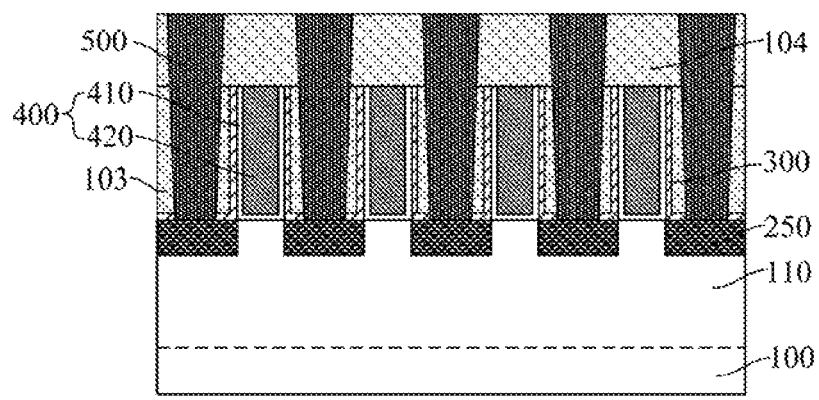

Referring to FIG. 23 and FIG. 24, a conductive plug 500 (as shown in FIG. 24) is formed in the second dielectric layer 103 and the etch stop layer 300 on both sides of the device gate structure 400, the conductive plug 500 spanning the fin 110, and the conductive plug 500 being connected to the source/drain doping region 250.

The conductive plug 500 is used to achieve an electrical connection between the source/drain doping region 250 and the external circuit.

In some implementations, the material of the conductive plug 500 is W. In other implementations, the material of the conductive plug may also be Al, Cu, Ag or Au.

In some implementations, the top position of the first dielectric layer 112 is used to define the bottom position of the conductive plug 500. Under the action of the first dielectric layer 112, the height of the conductive plug 500 on both sides of the fin 110 is reduced, thereby reducing the effective area between the conductive plug 500 and the device gate structure 400, reducing the parasitic capacitance between the conductive plug 500 and the device gate structure 400 accordingly, and further improving the performance (e.g., alternating current performance) of the semiconductor structure.

In some implementations, the conductive plug 500 is formed by using a non self-aligned contact etching process. That is, a formation position of the conductive plug 500 is defined by a mask opening formed in a mask layer, and the mask opening is located on either side of the device gate structure 400.

Specifically, the step of forming the conductive plug 500 includes the following steps:

As shown in FIG. 23, a trench 550 exposing the source/drain doping region 250 and the first electric layer 112 is formed in the second dielectric layer 103 and the etch stop layer 300 by using a non self-aligned contact etching process, where an extending direction of the trench 550 is perpendicular to an extending direction of the fin 110, and the trench 550 spans the fin 110.

The trench 550 is used to provide a spatial location for subsequent formation of the conductive plug.

Specifically, a mask layer 600 is formed on the gate structure 400 and the second dielectric layer 103. A mask opening 610 exposing the partial second dielectric layer 103 on both sides of the gate structure 400 is formed in the mask layer 600. An extending direction of the mask opening 610 is parallel to an extending direction of the gate structure 400, and the mask opening 610 spans the fin 110. The mask layer 600 is used as a mask to sequentially etch the second dielectric layer 103 and the etch stop layer 300 exposed by the mask opening 610 to form a trench 550 exposing the source/drain doping region 250 and the first dielectric layer 112 (as shown in FIG. 20).

In some implementations, the mask opening 610 spans the fin 110, and therefore the trench 550 spans the fin 110 and exposes the source/drain doping region 250 and the first dielectric layer 112 on both sides of the fin 110.

With respect to the solution where a first dielectric layer is not formed, in some implementations, the trench 550 exposes the source/drain doping region 250 and the first dielectric layer 112, and the depth of the trench 550 above the source/drain doping region 250 is close to the depth of the trench 550 above the first dielectric layer 112, which is advantageous to reduce the probability of etch loss of the source/drain doping region 250, thereby increasing the process window for forming the trench 550.

Moreover, some implementations of the present disclosure do not need to remove the device gate structure 400 of a partial thickness as compared with the solution of using a self-aligned contact etching process, and therefore, the height of the device gate structure 400 is smaller, which correspondingly reduces the difficulty of the etching process used during the formation of the gate structure 200.

In addition, since the height of the device gate structure 400 is smaller, in the photolithography process of forming the trench 550, a lithography device is more likely to achieve alignment, thereby facilitating improvement of the overlay (OVL) precision.

The etch stop layer 300 also covers a sidewall of the device gate structure 400, the etch stop layer 300 being capable of protecting the sidewall of the device gate structure 400 during formation of the trench 550, so as to reduce the probability of the non self-aligned contact etching process causing erroneous etching of the device gate structure 400.

In some implementations, the trench 550 is formed by etching using the dry etching process. Specifically, in the process of forming the trench 550, the mask layer 600 is used as a mask, and the surface of the etch stop layer 300 is used as a stop position. The second dielectric layer 103 exposed by the mask opening 610 is etched to form an initial trench, and then the etch stop layer 300 exposed by the initial trench is etched.

In some implementations, the mask layer 600 is a photoresist layer. After the trench 550 is formed, the mask layer 600 is removed in an ashing or wet-process photoresist-removing manner.

It is to be noted that, after forming the second dielectric layer 103, the method further includes: forming a third dielectric layer 104 covering the second dielectric layer 103. Correspondingly, the mask layer 600 is formed on the third dielectric layer 104. Before etching the second dielectric layer 103 exposed by the mask opening 610, the method further includes: etching the third dielectric layer 104 exposed by the mask opening 610.

The third dielectric layer 104 is also used to achieve electrical isolation between adjacent devices. Moreover, the third dielectric layer 104 is also used to provide a process platform for forming a conductive plug electrically connected to the device gate structure 400.

Therefore, the material of the third dielectric layer 104 is an insulating material. In some implementations, the material of the third dielectric layer 104 is silicon oxide. The material of the third dielectric layer 104 is the same as that of the first dielectric layer 112 and the second dielectric layer 103, thereby reducing the complexity of the etching process. In other implementations, the material of the third dielectric layer may also be other insulating materials such as silicon oxynitride.

Referring to FIG. 24, the trench 550 (as shown in FIG. 23) is filled to form the conductive plug 500.

The conductive plug 500 is electrically connected to the source/drain doping layer 250 for electrically connecting the source/drain doping layer 250 to the external circuit.

In some implementations, the material of the source/drain doping layer 250 is W. W has the advantages of high melting point, good thermal stability, good electrical conductivity, strong step coverage, and strong electromigration resistance. By selecting a W material, it is advantageous to improve the performance of a device. Moreover, the thermal expansion coefficient of W is similar to that of Si. Therefore, it is also advantageous to reduce the stress in the conductive plug 500. In other implementations, the material of the conductive plug may also be a conductive material such as Al, Cu, Ag or Au.

Specifically, the step of forming the conductive plug 500 includes: filling the trench 550 with a conductive material, the conductive material also covering the top of the third dielectric layer 104; and planarizing the conductive material, removing the conductive material above the top of the third dielectric layer 104, and retaining the conductive material in the trench 550 as the conductive plug 500.

In some implementations, the trench 550 is filled with a conductive material by using a chemical vapor deposition process. By using the chemical vapor deposition process, it is advantageous to increase the filling ability of the conductive material, and it is advantageous to reduce the stress in the conductive plug 500. In other implementations, the conductive plug may also be formed by a physical vapor deposition process, a sputtering process, or an electroplating process.

In some implementations, the conductive material is planarized by using a chemical mechanical grinding process, thereby improving the surface flatness of the conductive plug 500, and enabling the top of the conductive plug 500 to be flush with the top of the third dielectric layer 104.

The present disclosure further provides a semiconductor structure. Referring to FIG. 24, FIG. 24 is a cross-sectional view in an extending direction (shown in the Y1Y2 direction in FIG. 9) of a fin at a top position of a gate structure, and a schematic structural diagram of one form of a semiconductor structure according to the present disclosure is shown.

The semiconductor structure includes: a substrate 100; a fin 110, protruding from the substrate 100; a device gate structure 400, spanning the fin 110 and covering a partial sidewall and a partial top of the fin 110; a source/drain doping region 250, located in the fin 110 on both sides of the device gate structure 400; a first dielectric layer 112 (as shown in FIG. 20), located on the substrate 100 exposed by the fin 110, the first dielectric layer 112 exposing the top of the fin 110; an etch stop layer 300, conformally covering the fin 110 and the source/drain doping region 250 exposed by the first dielectric layer 112, and the first dielectric layer 112; a second dielectric layer 103, located on the etch stop layer 300, the second dielectric layer 103 covering a sidewall of the device gate structure 400; and a conductive plug 500, penetrating through the second dielectric layer 103 and the etch stop layer 300 on both sides of the device gate structure 400, the conductive plug 500 spanning the fin 110, and the conductive plug 500 being connected to the source/drain doping region 250.

The top position of the first dielectric layer 112 is used to define the bottom position of the conductive plug 500. Under the action of the first dielectric layer 112, the height of the conductive plug 500 above the source/drain doping region 250 is close to the height of the conductive plug 500 on both sides of the fin 110, so that the height of the conductive plug 500 on both sides of the fin 110 is reduced, thereby reducing the effective area between the conductive plug 500 and the device gate structure 400, reducing the parasitic capacitance between the conductive plug 500 and the device gate structure 400 accordingly, and further improving the performance (e.g., alternating current performance) of the semiconductor structure.

In some implementations, the substrate 100 is a silicon substrate. In other implementations, the material of the substrate may also be other materials such as germanium, silicon germanide, silicon carbide, gallium arsenide or indium gallide, and the substrate can also be other types of substrates such as a silicon substrate on an insulator or a germanium substrate on an insulator.

The fin 110 is used to provide a channel for the fin field effect transistor.

In some implementations, the fin 110 and the substrate 100 are of an integrated structure. In other implementations, the fin may also be a semiconductor layer epitaxially grown on the substrate for the purpose of accurately controlling the fin height.

To this end, in some implementations, the material of the fin 110 is the same as the material of the substrate 100, and the material of the fin 110 is silicon. In other implementations, the material of the fin may also be a semiconductor material suitable for forming a fin, such as germanium, silicon germanide, silicon carbide, gallium arsenide or indium gallide, and the material of the fin may also be different from the material of the substrate.

As shown in FIG. 20, FIG. 20 is a cross-sectional view in a direction perpendicular to an extending direction (as shown in the X1X2 direction in FIG. 9) of a fin on one side of a device gate structure. In some implementations, an isolating layer 101 is formed on the substrate 100 exposed by the fin 110, and the isolating layer 101 covers a partial sidewall of the fin 110.

The isolating layer 101 serves as a shallow trench isolating structure for isolating adjacent devices. In some implementations, the material of the isolating layer 101 is silicon oxide. In other implementations, the material of the isolating layer may also be other insulating materials such as silicon nitride or silicon oxynitride.

The device gate structure 400 is used to control the turn-on and turn-off of a channel region of a transistor.

In some implementations, the device gate structure 400 is a metal gate structure. Therefore, the device gate structure 400 includes: a high-k gate dielectric layer 410 and a gate electrode layer 420 covering the high-k gate dielectric layer 410.

The high-k gate dielectric layer 410 is used to achieve electrical isolation between the gate electrode layer 420 and a channel.

The material of the high-k gate dielectric layer 410 is a high-k dielectric material. The high-k dielectric material refers to a dielectric material having a relative dielectric constant greater than a relative dielectric constant of silicon oxide. In some implementations, the material of the high-k gate dielectric layer 410 is $HfO_2$. In other implementations, the material of the high-k gate dielectric layer may also be selected from $ZrO_2$, HfSiO, HfS iON, HfTaO, HfTiO, HfZrO or $Al_2O_3$.

In other implementations, when the device gate structure is a polysilicon gate structure, the material of the gate dielectric layer includes one or more of silicon oxide, silicon nitride, silicon oxynitride, silicon carbide, silicon carbonitride, and silicon oxycarbonitride.

The gate electrode layer 420 serves as an electrode for achieving an electrical connection with an external circuit. In some implementations, the material of the gate electrode layer 420 is Al. In other implementations, the material of the gate electrode layer may also be W, Cu, Ag, Au, Pt, Ni or Ti.

It is to be noted that a functional layer such as a work function layer is also formed between the high-k gate dielectric layer 410 and the gate electrode layer 420. For the convenience of illustration, other functional layers are not illustrated in some implementations.

In some implementations, a side wall (not shown) is further formed on a sidewall of the device gate structure 400. The side wall is used to protect the sidewall of the device gate structure 400, and is also used to define a formation region of the source/drain doping region 250, such that the source and drain doping region 250 has a certain distance from the device gate structure 400.

It is to be noted that, for convenience of illustration, the side wall is not shown in some implementations.

The source/drain doping region 250 includes an epitaxial layer doped with conductive ions.

In some implementations, for example, the semiconductor structure is a PMOS transistor. The material of the source/drain doping region 250 is silicon germanide doped with P-type ions. That is, the material of the epitaxial layer is silicon germanide. The epitaxial layer is used to provide a pressure stress effect on a channel region of the PMOS transistor, thereby increasing the carrier mobility of the PMOS transistor. The P-type ions include B, Ga or In.

In other implementations, the semiconductor structure may also be an NMOS transistor, and the material of the source/drain doping region is correspondingly silicon carbide or silicon phosphide doped with N-type ions. That is, the material of the epitaxial layer is silicon carbide or silicon phosphide. The epitaxial layer is used to provide a tensile stress effect on a channel region of the NMOS transistor, thereby increasing the carrier mobility of the NMOS transistor. The N-type ions include P, As or Sb.

The first dielectric layer 112 is used to achieve electrical isolation between adjacent devices, and is also used to provide a process platform for forming an etch stop layer 300. Therefore, the material of the first dielectric layer 112 is an insulating material. In some implementations, the material of the first dielectric layer 112 is silicon oxide. In other implementations, the material of the first dielectric layer may also be other insulating materials such as silicon oxynitride.

In some implementations, the first dielectric layer 112 exposes the top of the fin 110, so that the etch stop layer 300 can cover the source/drain doping region 250, thereby enabling the etch stop layer 300 to play a corresponding role in the process of forming a conductive plug 500. Moreover, the etch stop layer 300 can cover the fin 110 to protect the top of the fin 110.

In some implementations, the top of the first dielectric layer 112 is flush with the top of the fin 110. The conductive plug 500 spans the fin 110, and the conductive plug 500 is electrically connected to the source/drain doping region 250. Therefore, the top position of the first dielectric layer 112 is used to define the bottom position of the conductive plug 500. The height of the conductive plug 500 on both sides of the fin 110 can be significantly reduced by aligning the top of the first dielectric layer 112 with the top of the fin 110. In other implementations, the top of the first dielectric layer may also be below the top of the fin according to process requirements.

The process of forming the conductive plug 500 includes: forming a trench by an etching process. The process of forming the trench includes the step of etching a second dielectric layer 103, where the top of the etch stop layer 300 is used to define a stop position of the etching process during the process of etching the second dielectric layer 103, thereby reducing the probability of over-etching the first dielectric layer 112 and causing etch damage to the source/drain doping region 250.

Therefore, the material of the etch stop layer 300 includes one or more of silicon nitride, silicon carbonitride, silicon carbide and silicon oxynitride. The aforementioned material is a dielectric material, which has high hardness and density, such that the etch stop layer 300 can play a corresponding role. In some implementations, the material of the etch stop layer 300 is silicon nitride.

In some implementations, the etch stop layer 300 also covers the sidewall of the device gate structure 400. The etch stop layer 300 protects the sidewall of the device gate structure 400, so as to reduce the probability of damage to the device gate structure 400 caused by the process of forming the conductive plug 500.

The second dielectric layer 103 is also used to achieve electrical isolation between adjacent devices. Therefore, the material of the second dielectric layer 103 is an insulating material.

In some implementations, the material of the second dielectric layer 103 is silicon oxide. Silicon oxide is a material commonly used as a dielectric layer in the field of semiconductors, which is low in process cost. Moreover, the materials of the first dielectric layer 112 and the second dielectric layer 103 are both silicon oxide, which significantly alleviates the problem of stress between the first dielectric layer 112 and the etch stop layer 300 and between the second dielectric layer 103 and the etch stop layer 300, such that the adhesion between the first dielectric layer 112 and the etch stop layer 300 and between the second dielectric layer 103 and the etch stop layer 300 is better. A stable ONO stacked structure is thus obtained.

In other implementations, the material of the second dielectric layer may also be other insulating materials such as silicon oxynitride.

It is also to be noted that the semiconductor structure further includes: a third dielectric layer 104 located on the second dielectric layer 103. The third dielectric layer 104 is also used to achieve electrical isolation between adjacent devices. Moreover, the third dielectric layer 104 is used to provide a process platform for forming a conductive plug electrically connected to the device gate structure 400.

Therefore, the material of the third dielectric layer 104 is an insulating material. In some implementations, the material of the third dielectric layer 104 is silicon oxide. The material of the third dielectric layer 104 is the same as that of the first dielectric layer 112 and the second dielectric layer 103, thereby reducing the complexity of the etching process. In other implementations, the material of the third dielectric layer may also be other insulating materials such as silicon oxynitride.

The conductive plug 500 is used to achieve an electrical connection between the source/drain doping region 250 and the external circuit.

In some implementations, the material of the conductive plug 500 is W. In other implementations, the material of the conductive plug may also be Al, Cu, Ag or Au.

Specifically, the conductive plug 500 penetrates through the third dielectric layer 104, the second dielectric layer 103 and the etch stop layer 300 on both sides of the device gate structure 400.

The semiconductor structure may be formed by implementations of the method for forming a semiconductor structure described above, or may also be formed by other formation methods. For a detailed description of the semiconductor structure in some implementations, reference may be made to the corresponding description in the foregoing embodiments and implementations, and the descriptions are omitted here in some implementations.

Although the present disclosure is disclosed above, the present disclosure is not limited thereto. Any person skilled in the art can make various changes and modifications without departing from the spirit and scope of the present disclosure, and the scope of the present disclosure should be determined by the scope defined by the claims.

What is claimed is:

1. A method for forming a semiconductor structure, comprising:
    providing a substrate and a fin protruding from the substrate, wherein a gate structure is formed on the substrate such that the gate structure spans the fin and covers a partial sidewall and a partial top of the fin, and a source/drain doping region is formed in the fin on both sides of the gate structure;
    forming, after forming the source/drain doping region, a first dielectric layer on the substrate exposed by the fin, where the first dielectric layer exposes a top of the fin;
    forming an etch stop layer, the etch stop layer conformally covering the first dielectric layer and the fin and the source/drain doping region exposed by the first dielectric layer;
    forming a second dielectric layer on the etch stop layer; and
    forming a conductive plug penetrating through the second dielectric layer and the etch stop layer, the conductive plug spanning the fin, and the conductive plug being connected to the source/drain doping region.

2. The method for forming a semiconductor structure according to claim 1, wherein the step of forming the first dielectric layer comprises:
    forming a first dielectric material layer on the substrate exposed by the fin, where a top of the first dielectric material layer is flush with a top of the gate structure; and
    etching back the first dielectric material layer of a partial thickness to expose the top of the fin.

3. The method for forming a semiconductor structure according to claim 2, wherein the first dielectric material layer of a partial thickness is etched back using a dry etching process.

4. The method for forming a semiconductor structure according to claim 1, wherein in the step of forming the first dielectric layer, the top of the first dielectric layer is flush with the top of the fin.

5. The method for forming a semiconductor structure according to claim 1, wherein:
    the gate structure is a dummy gate structure;
    in the step of forming a second dielectric layer on the etch stop layer, the second dielectric layer covers a sidewall of the gate structure; and
    the method further comprises: after forming a second dielectric layer on the etch stop layer and before forming a conductive plug penetrating through the second dielectric layer and the etch stop layer, removing the gate structure, forming a gate opening in the first dielectric layer and the second dielectric layer, and forming a device gate structure in the gate opening.

6. The method for forming a semiconductor structure according to claim 5, wherein:
    in the step of forming the etch stop layer, the etch stop layer conformally covers the first dielectric layer and the gate structure, the fin and the source/drain doping region exposed by the first dielectric layer;
    the step of forming the second dielectric layer comprises: forming a second dielectric material layer covering the etch stop layer, planarizing the second dielectric material layer, and removing the second dielectric material layer above the top of the etch stop layer, the remaining second dielectric material layer serving as the second dielectric layer; and
    the method further comprises: after forming the second dielectric layer and before removing the gate structure, removing the etch stop layer on the top of the gate structure.

7. The method for forming a semiconductor structure according to claim 1, wherein the step of forming the conductive plug comprises:
    forming a trench in the second dielectric layer and the etch stop layer using a non self-aligned contact etching process, wherein the trench exposes the source/drain doping region and the first electric layer, an extending direction of the trench is perpendicular to an extending direction of the fin, and the trench spans the fin; and
    filling the trench to form the conductive plug.

8. The method for forming a semiconductor structure according to claim 6, wherein the second dielectric material layer is planarized using a chemical mechanical grinding process.

9. The method for forming a semiconductor structure according to claim 1, wherein the material of the etch stop layer comprises at least one of silicon nitride, silicon carbonitride, silicon carbide or silicon oxynitride.

10. The method for forming a semiconductor structure according to claim 1, wherein the material of the second dielectric layer and the material of the first dielectric layer are silicon oxide.

11. A semiconductor structure, comprising:
    a substrate;
    a fin, protruding from the substrate;
    a device gate structure, spanning the fin and covering a partial sidewall and a partial top of the fin;

a source/drain doping region, located in the fin on both sides of the device gate structure;

a first dielectric layer, located on the substrate exposed by the fin, the first dielectric layer exposing a top of the fin, wherein a top of the first dielectric layer is flush with the top of the fin;

an etch stop layer, covering the fin and the source/drain doping region exposed by the first dielectric layer, and the first dielectric layer;

a second dielectric layer, located on the etch stop layer, the second dielectric layer covering a sidewall of the device gate structure; and a conductive plug, penetrating through the second dielectric layer and the etch stop layer on both sides of the device gate structure, the conductive plug spanning the fin, and the conductive plug being connected to the source/drain doping region.

12. The semiconductor structure according to claim 11, wherein the etch stop layer also covers the sidewall of the device gate structure.

13. The semiconductor structure according to claim 11, wherein the material of the etch stop layer comprises one or more of silicon nitride, silicon carbonitride, silicon carbide and silicon oxynitride.

14. The semiconductor structure according to claim 11, wherein the material of the second dielectric layer and the material of the first dielectric layer are silicon oxide.

* * * * *